United States Patent
Dai et al.

(10) Patent No.: US 8,916,980 B2
(45) Date of Patent: Dec. 23, 2014

(54) PAD AND CIRCUIT LAYOUT FOR SEMICONDUCTOR DEVICES

(75) Inventors: Tiejun Dai, Santa Clara, CA (US); Kuei Chen Liang, Jhubei (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 24 days.

(21) Appl. No.: 13/398,364

(22) Filed: Feb. 16, 2012

(65) Prior Publication Data

US 2013/0214375 A1 Aug. 22, 2013

(51) Int. Cl.
*H01L 23/48* (2006.01)

(52) U.S. Cl.
USPC ........ 257/786; 257/432; 257/620; 257/E23.02

(58) Field of Classification Search
CPC . H01L 21/78; H01L 21/8234; H01L 21/8238; H01L 2223/54453; H01L 2223/5446; H01L 24/05; H01L 2224/04042
USPC .............................. 257/786, 432, 620, E23.02
See application file for complete search history.

(56) References Cited

U.S. PATENT DOCUMENTS

| 5,291,010 | A | | 3/1994 | Tsuji |
| 5,341,024 | A | * | 8/1994 | Rosotker ...................... 257/620 |
| 5,510,623 | A | | 4/1996 | Sayag et al. |
| 5,859,448 | A | * | 1/1999 | Brassington ................... 257/203 |
| 6,030,885 | A | * | 2/2000 | Bothra .......................... 438/460 |
| 6,043,134 | A | * | 3/2000 | Bishop .......................... 438/401 |
| 6,153,506 | A | * | 11/2000 | Kermani ....................... 438/617 |
| 6,165,815 | A | * | 12/2000 | Ball .............................. 438/113 |
| 6,528,864 | B1 | * | 3/2003 | Arai .............................. 257/620 |
| 6,713,843 | B2 | * | 3/2004 | Fu ................................ 257/620 |
| 7,098,077 | B2 | * | 8/2006 | Huang et al. .................. 438/110 |
| 2003/0222325 | A1 | * | 12/2003 | Jacobsen et al. ............. 257/432 |
| 2005/0056903 | A1 | * | 3/2005 | Yamamoto et al. ........... 257/433 |
| 2006/0278956 | A1 | * | 12/2006 | Cadouri ........................ 257/620 |
| 2008/0024635 | A1 | | 1/2008 | Liu et al. |
| 2008/0220220 | A1 | * | 9/2008 | Wang et al. ................... 428/192 |
| 2008/0224192 | A1 | * | 9/2008 | England et al. ............... 257/294 |
| 2008/0290438 | A1 | * | 11/2008 | Weng et al. ................... 257/434 |
| 2010/0019354 | A1 | * | 1/2010 | Farooq et al. ................. 257/620 |
| 2010/0090304 | A1 | * | 4/2010 | Liu et al. ...................... 257/432 |
| 2010/0117181 | A1 | * | 5/2010 | Kim et al. ..................... 257/432 |

* cited by examiner

*Primary Examiner* — Steven J Fulk
(74) *Attorney, Agent, or Firm* — Blakely Sokoloff Taylor & Zafman LLP

(57) ABSTRACT

An apparatus includes an image sensor with a frontside and a backside. The image sensor includes an active circuit region and bonding pads. The active circuit region has a first shape that is substantially rectangular. The substantially rectangular first shape has first chamfered corners. A perimeter of the frontside of the image sensor has a second shape that is substantially rectangular. The second substantially rectangular shape has second chamfered corners. The bonding pads are disposed on the frontside of the image sensor. The bonding pads are disposed between the first chamfered corners and the second chamfered corners. The first shape is disposed inside the second shape.

19 Claims, 16 Drawing Sheets

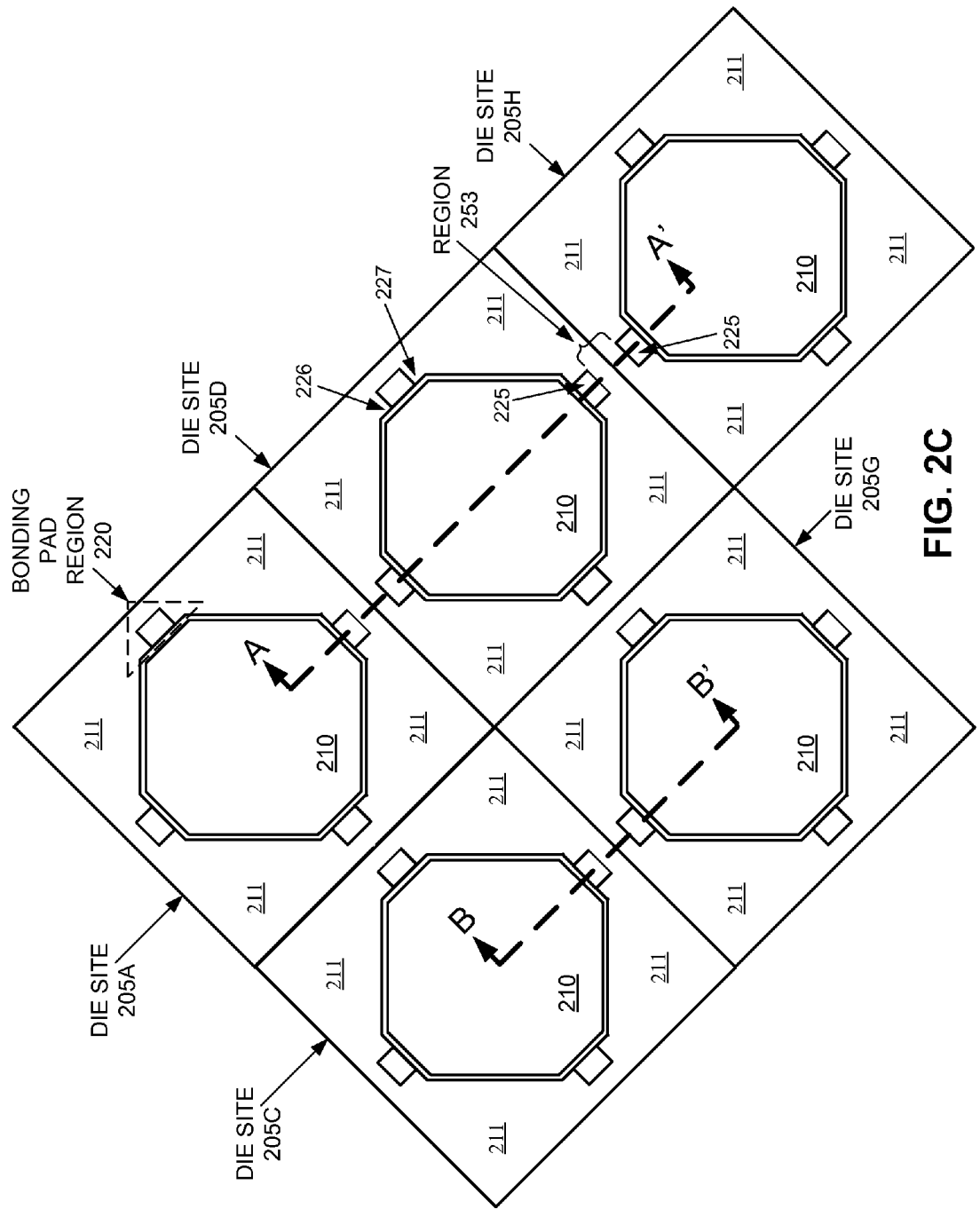

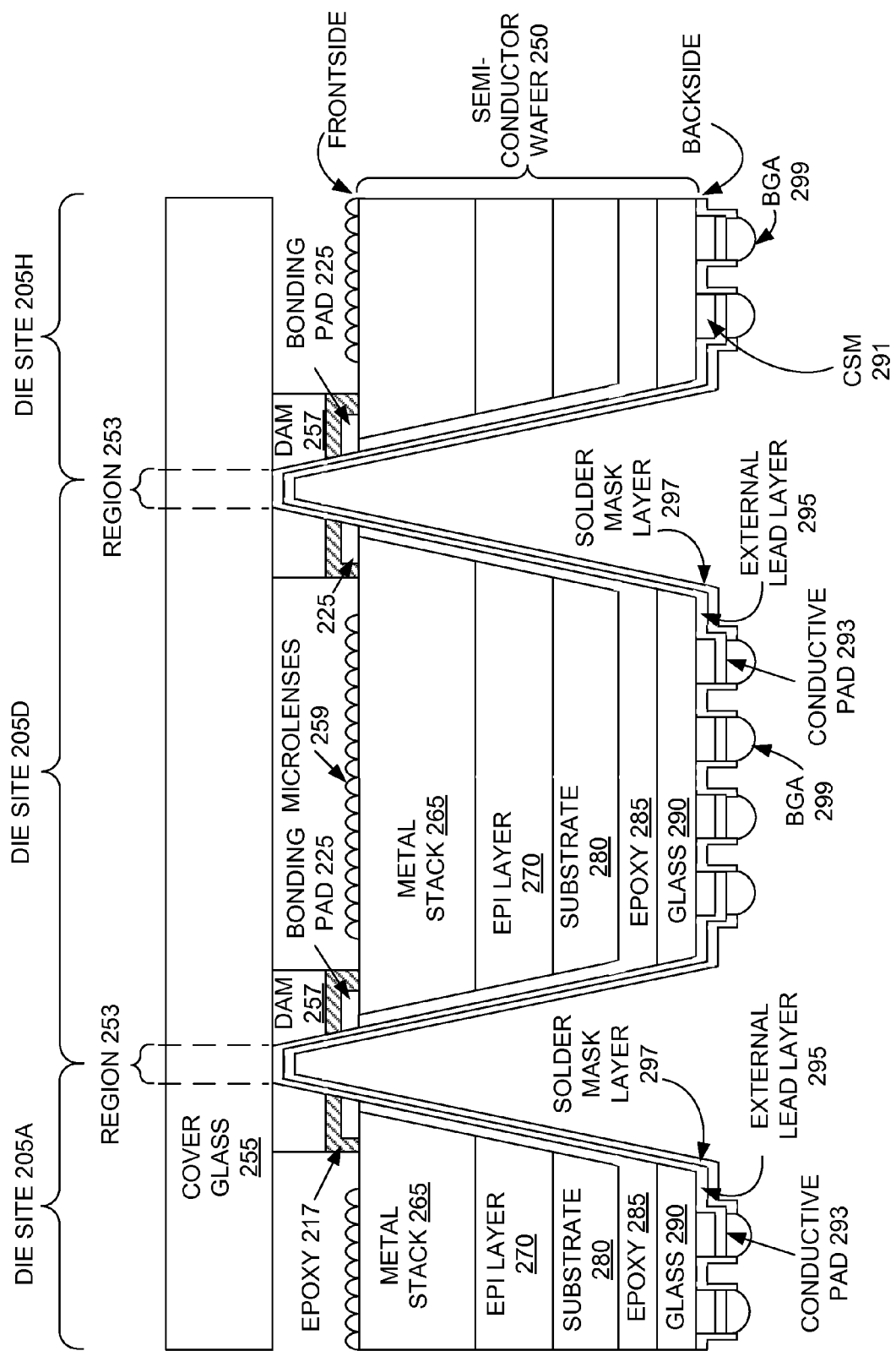

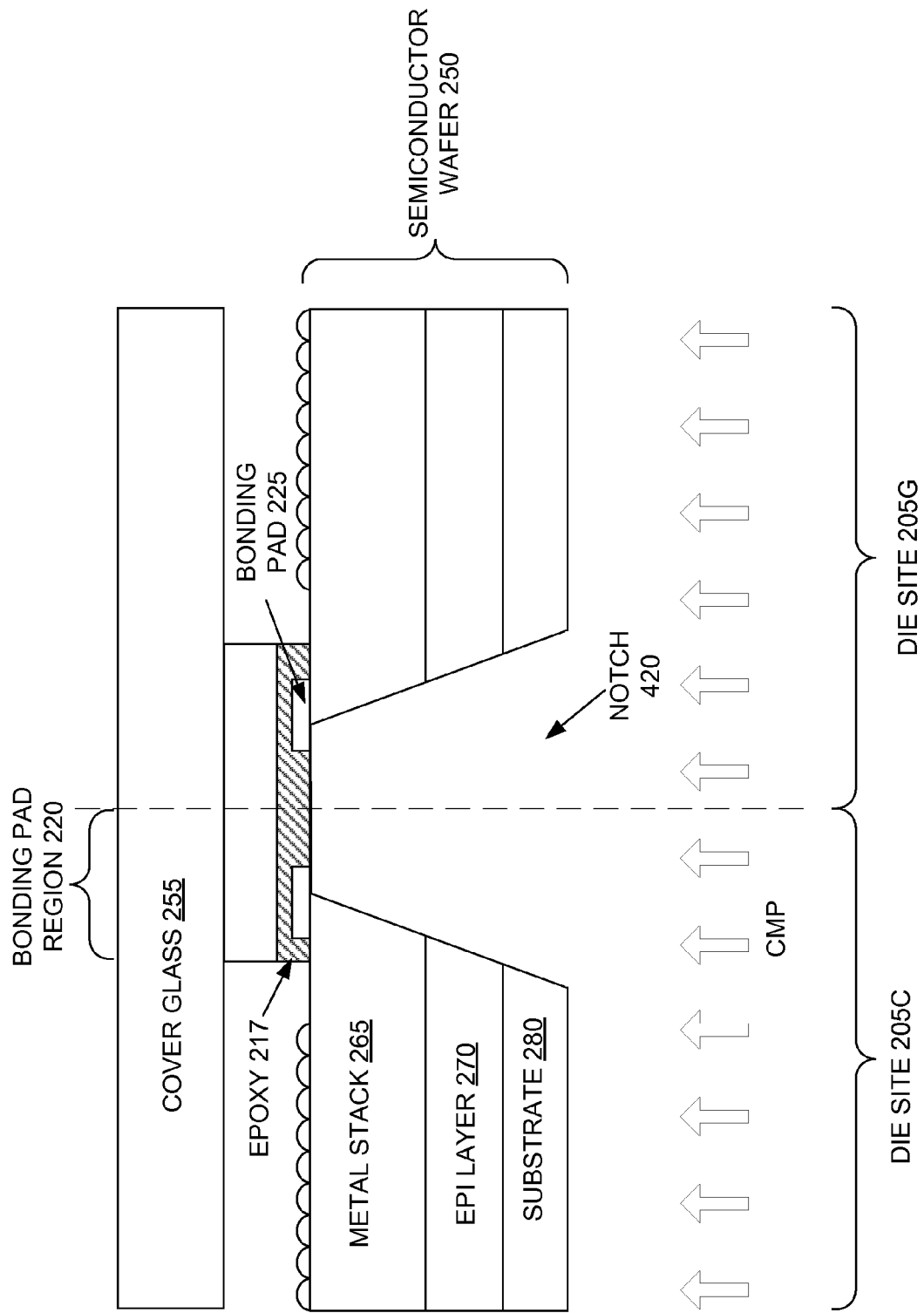

PAD AND CIRCUIT LAYOUT FOR SEMICONDUCTOR DEVICES

TECHNICAL FIELD

This disclosure relates generally to semiconductor devices, and in particular but not exclusively, relates to image sensors.

BACKGROUND INFORMATION

As the size of semiconductor devices decrease, connecting on-chip electrical signals to off-chip pads or pins becomes increasingly challenging, especially while trying to increase the active circuit region of the semiconductor device. Part of the challenge includes designing semiconductor devices that conform to "design rules." Design rules are a series of parameters provided by semiconductor manufacturers and specify certain physical requirements for the spacing and width of semiconductor elements. Some of the design rules require a minimum separation between the active circuit region, bonding pads, and the edge of a semiconductor device.

FIG. 1A is a planar top view of a convention semiconductor device 100. Semiconductor device 100 comprises active circuit region 110 and bonding pad region 120. Distances 126, 127, 128 and 129 are examples of distances that are subject to design rules. FIG. 1B is a planar top view of a conventional semiconductor device 150 which comprises active circuit region 160 and bonding pad region 170. In semiconductor device 150, bonding pads 175 are formed along one side of active circuit region 160, instead of surrounding the active region, as seen in FIG. 1A.

One example of a space critical application of semiconductor devices is CMOS image sensors used in endoscopes. It is desirable for endoscopes to be as small as possible (while still maintaining imaging quality) in order to be minimally-invasive. In endoscope and other applications, configurations and layouts to route on-chip electrical signals off-chip while increasing the active circuit region of the chip are desirable.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 2C is a zoomed-in layout view of semiconductor devices on dies sites on the wafer shown in FIG. 2B, in accordance with an embodiment of the disclosure.

FIG. 2D is a cross-sectional view through line A-A' of FIG. 2C showing a diagram of an image sensor within a wafer, in accordance with an embodiment of the disclosure.

FIGS. 4A-4F are cross sectional views through line B-B' of FIG. 2C that show diagrams of process steps of a method of fabricating an image sensor in a chip-scale package, in accordance with an embodiment of the disclosure.

DETAILED DESCRIPTION

Embodiments of an apparatus and methods of fabricating a semiconductor device are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used herein, the term "substrate" refers to any of a variety of substrates formed using semiconductor material—e.g. based upon silicon, silicon-germanium, germanium, gallium arsenide and/or the like. A substrate layer may include such a substrate and one or more structures resulting from operations that have been performed upon the substrate—e.g. such operations forming regions, junctions and/or other structures in the substrate. By way of illustration and not limitation, such structures may include one or more of doped semiconductor regions and/or undoped semiconductor regions, epitaxial layers of silicon, and other semiconductor structures formed upon the substrate.

Figure 1A:
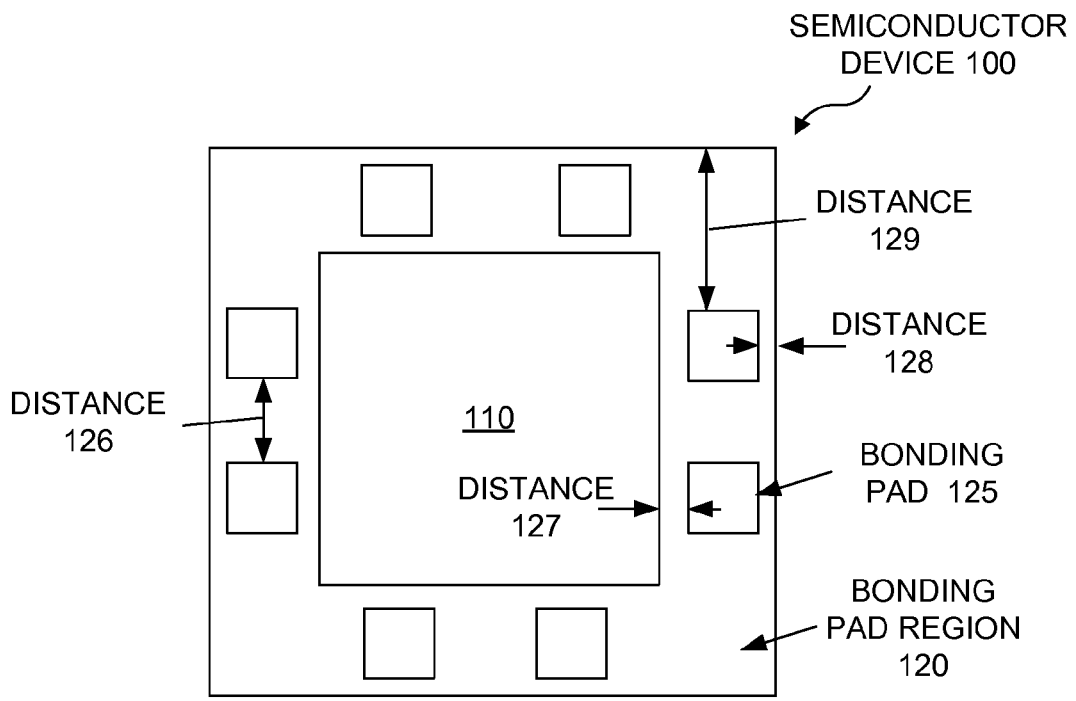
FIG. 1A is a planar top view of a conventional semiconductor device.
Figure 1B:
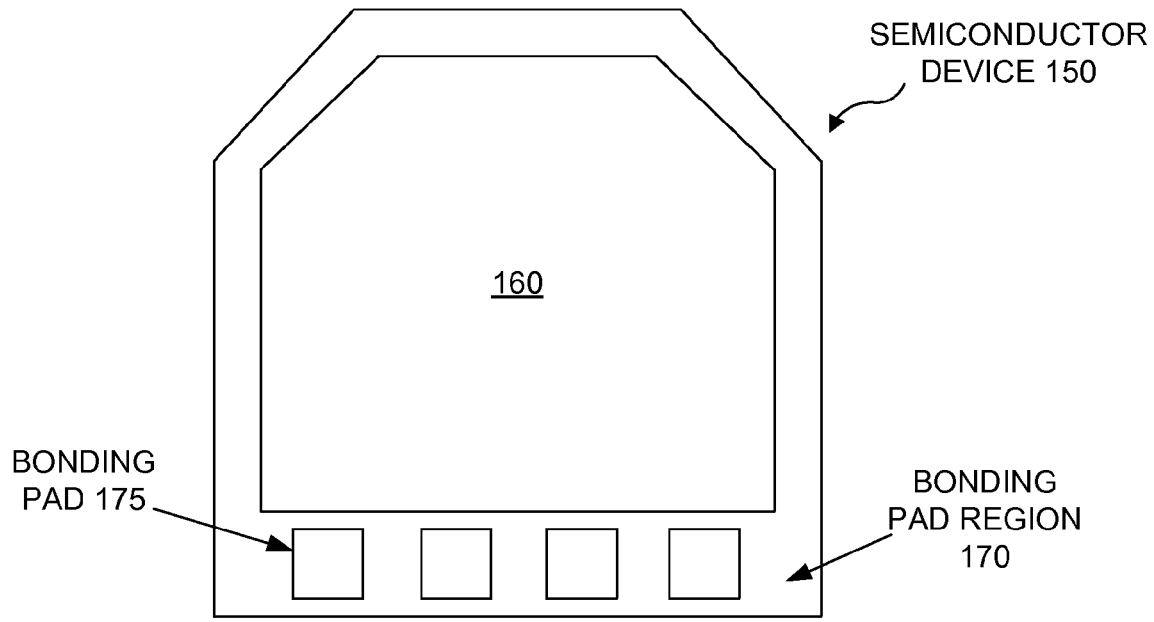
FIG. 1B is a planar top view of a conventional semiconductor device.
Figure 2A:
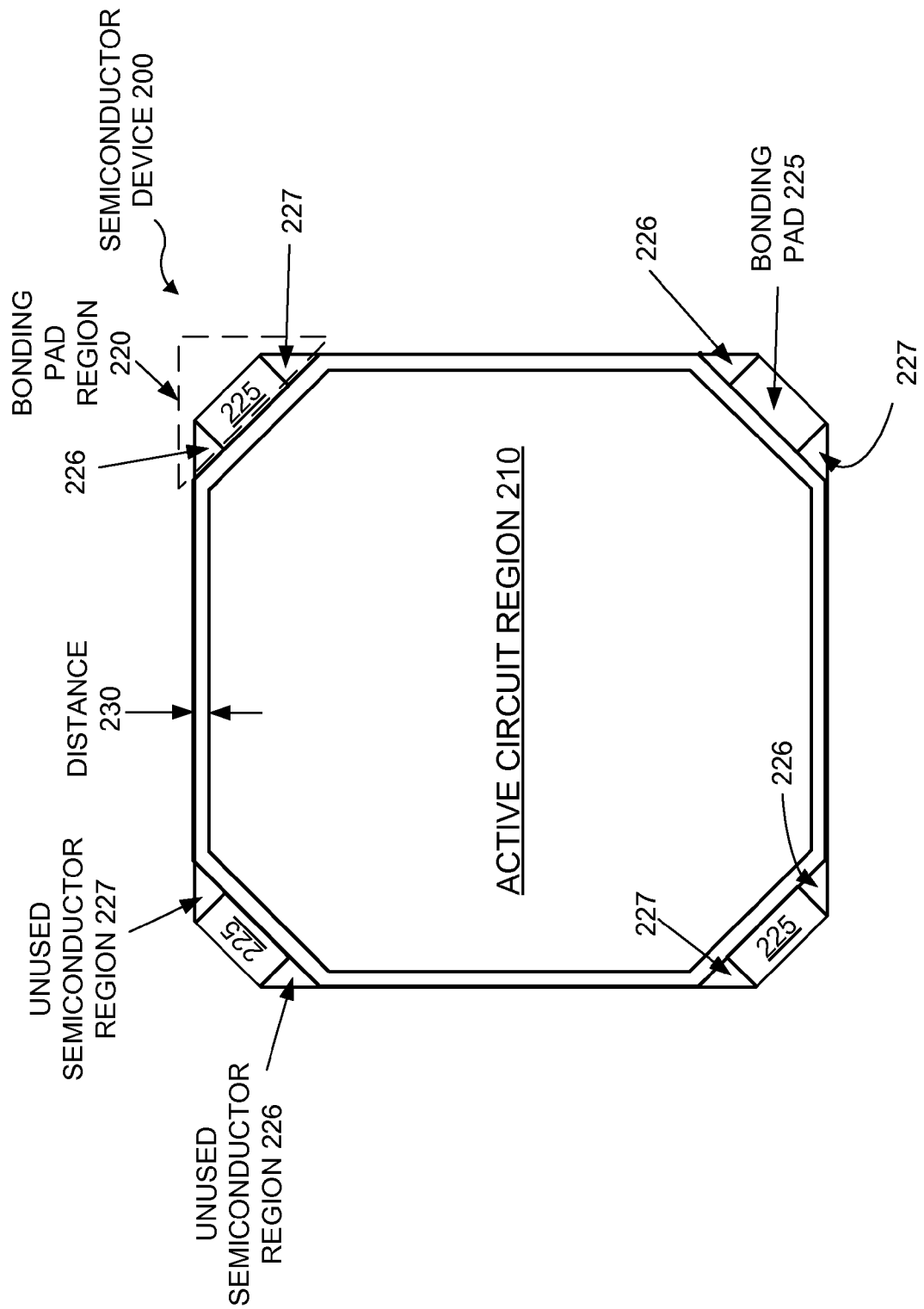
FIG. 2A is a planar top view of a layout of a semiconductor device, in accordance with an embodiment of the disclosure.

FIG. 2A is a planar top view of a layout of a semiconductor device 200, in accordance with an embodiment of the disclosure. The illustrated embodiment of semiconductor device 200 has a perimeter that is substantially rectangular with four chamfered corners. A chamfer is a flat surface formed by cut of an edge or corner, sometimes made at a 45° angle of each adjacent edge. The perimeter of semiconductor device 200 may have straight sides that connect to the chamfered corners. The perimeter may be octagon shaped with four smaller sides and four larger sides. An active circuit region 210 is disposed inside the perimeter of semiconductor device 200. Circuitry associated with bonding pads such as input/output buffers and electrostatic discharge protection circuits are formed in active circuit region 210. In an image sensor, a pixel array and associated readout circuitry may be formed in active circuit region 210. In the illustrated embodiment, active circuit region 210 is substantially rectangular with four chamfered corners and is offset from the perimeter of semiconductor device 200 by distance 230. Active circuit region 210 may be octagon shaped with four smaller sides and four larger sides. The four smaller sides of active circuit region may be aligned with and substantially parallel to the four smaller sides of the perimeter of semiconductor device 200.

Bonding pads 225 are disposed on the frontside of semiconductor device 200. In the illustrated embodiment, each of bonding pads 225 are disposed between each of the four chamfered corners of the perimeter of semiconductor device 200 and each of the chamfered corners of active circuit region 210. In the illustrated embodiment, bonding pads 225 are disposed between unused semiconductor region 226 and 227, which are both triangle shaped. In the illustrated embodiment, bonding pads 225 are substantially rectangular shaped. Unused semiconductor region 226 and 227 along with one of bonding pads 225 make up a bond pad region 220.

Figure 2B:
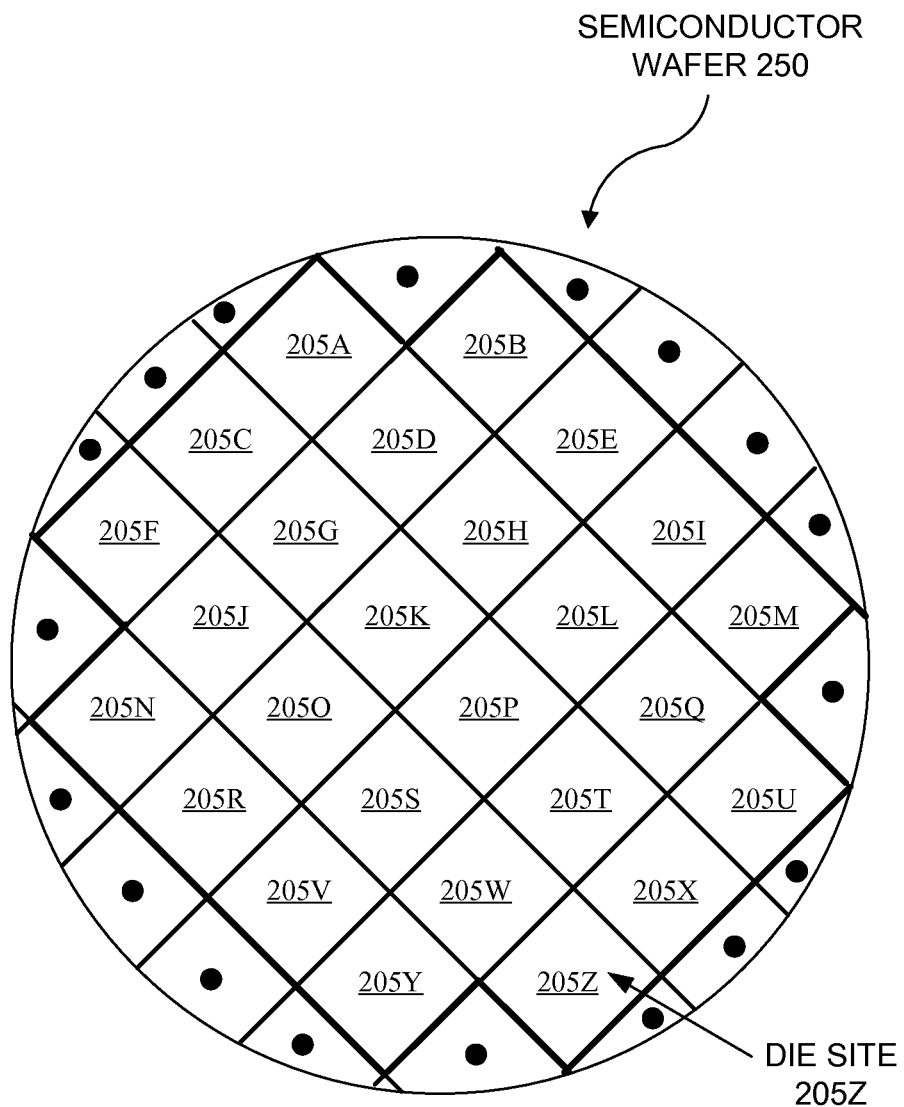
FIG. 2B is a layout view of die sites on a wafer where semiconductor devices are fabricated, in accordance with an embodiment of the disclosure.

FIG. 2B is a layout view of die sites 205 on a semiconductor wafer 250 where semiconductor devices are fabricated, in accordance with an embodiment of the disclosure. The illustrated embodiment of semiconductor wafer 250 includes twenty-six die sites 205 that are labeled 205A-205Z. More than twenty six die sites 205 are possible and a different configuration of die sites 205 than is shown in the illustrated embodiment is possible. Irregular die sites of various shapes and sizes are shown with dots ("●") to distinguish irregular die sites from regular die sites 205. The peripheral area of the semiconductor wafer occupied by the irregular die sites along with un-used semiconductor areas 211 (see FIG. 2C) may be referred to as "wasted real estate."

FIG. 2C is a zoomed-in layout view of semiconductor devices 200 on die sites 205A, 205C, 205D, 205G, and 205H on semiconductor wafer 250, in accordance with an embodiment of the disclosure. Each of die sites 205 includes unused semiconductor areas 211, which surrounds each semiconductor device 200. In the illustrated embodiment, each die site 205 is square shaped and each semiconductor device 200 has active circuit region 210 that is octagon shaped. In the illustrated embodiment, the four short sides of each active circuit region 210 face a side of their respective die site 205 and are in parallel with the side they are facing. In the illustrated embodiment, a region 253 separates a bonding pad 225 of the semiconductor device disposed in die site 205D and a bonding pad 225 of the semiconductor device disposed in die site 205H.

FIG. 2D is a cross-sectional view through line A-A' of FIG. 2C showing a diagram of an image sensor within wafer 250, in accordance with an embodiment of the disclosure. In FIG. 2D, each semiconductor device 200 in each die site 205 is an image sensor. Although each die site 205 contains an image sensor in FIG. 2D, each image sensor is still connected via semiconductor wafer 250, which is shown prior to die separation. The die separation process is sometimes known as "dicing" or "wafer dicing" and is accomplished using known methods such as a diamond saw or die saw.

FIG. 2D shows die site 205D and portions of die site 205A and die site 205H. Region 253 separates bonding pads 225 between each of die sites 205. Die site 205D has structures that facilitate transferring on-chip signals off-chip, including: ball grid array ("BGA") 299, solder mask layer 297, external lead layer 295, conductive pad 293, and chip scale metallization ("CSM") 291. Die site 205D includes semiconductor wafer 250 which includes a metal stack layer 265 above an epitaxial ("epi") layer 270, which is above a substrate layer 280. Substrate layer 280 is above an epoxy layer 285, which is above a glass layer 290. Bonding pads 225 and microlenses 259 are formed on the top of metal stack layer 265, which is the frontside of semiconductor wafer 250. Each microlens of the microlenses 259 is part of a pixel that is part of a pixel array that may be disposed in epitaxial ("epi") layer 270. Each microlens of the microlenses 259 focuses incident light upon photosensitive regions of their respective pixel. Epoxy 217 is disposed on top of and adjacent to bonding pads 225. Dam 257 is disposed over epoxy 217 and dam 257 supports cover glass 255 which is disposed above die site 205D and extends to cover the other die sites 205. Many of the components of die site 205D will be explained further in connection with the fabrication process shown in FIG. 4A-4F.

Figure 3:
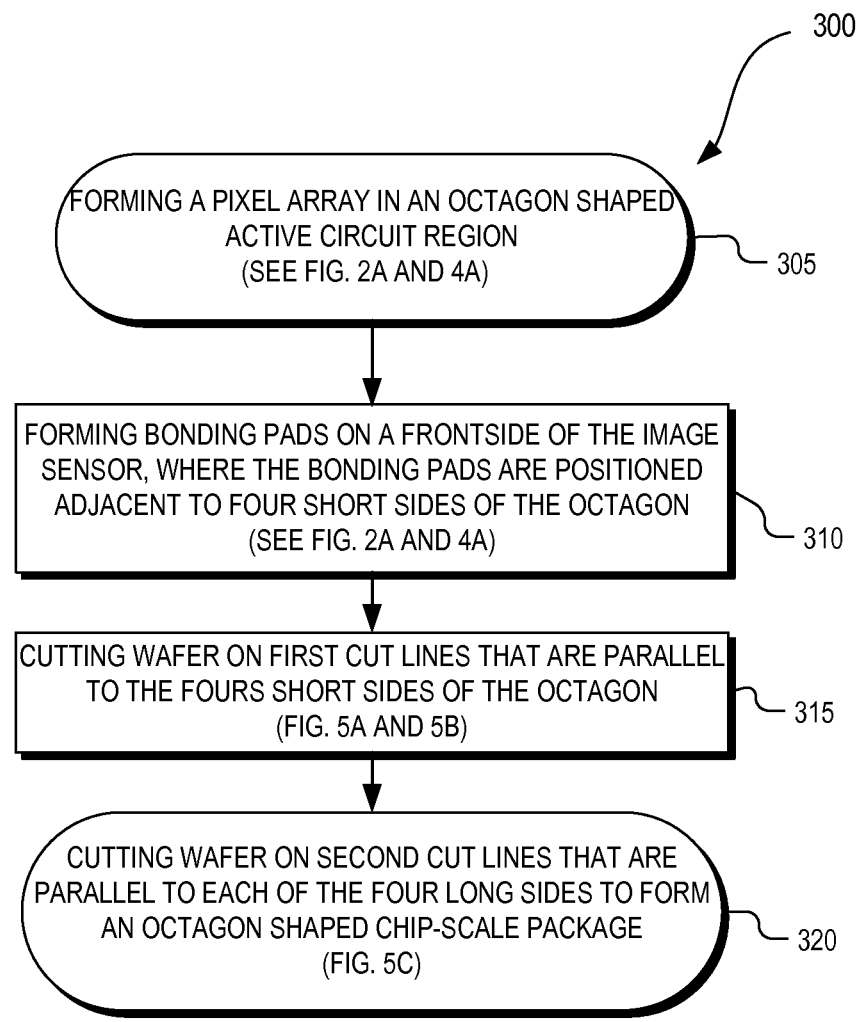
FIG. 3 is a flow chart showing a method of fabricating an image sensor in a chip-scale package, in accordance with an embodiment of the disclosure.

FIG. 3 is a flow chart showing a method of fabricating an image sensor in a chip-scale package, in accordance with an embodiment of the disclosure. The order in which some or all of the process blocks appear in process 300 should not be deemed limiting. Rather, one of ordinary skill in the art having the benefit of the present disclosure will understand that some of the process blocks may be executed in a variety of orders not illustrated, or even in parallel.

Figure 4A:
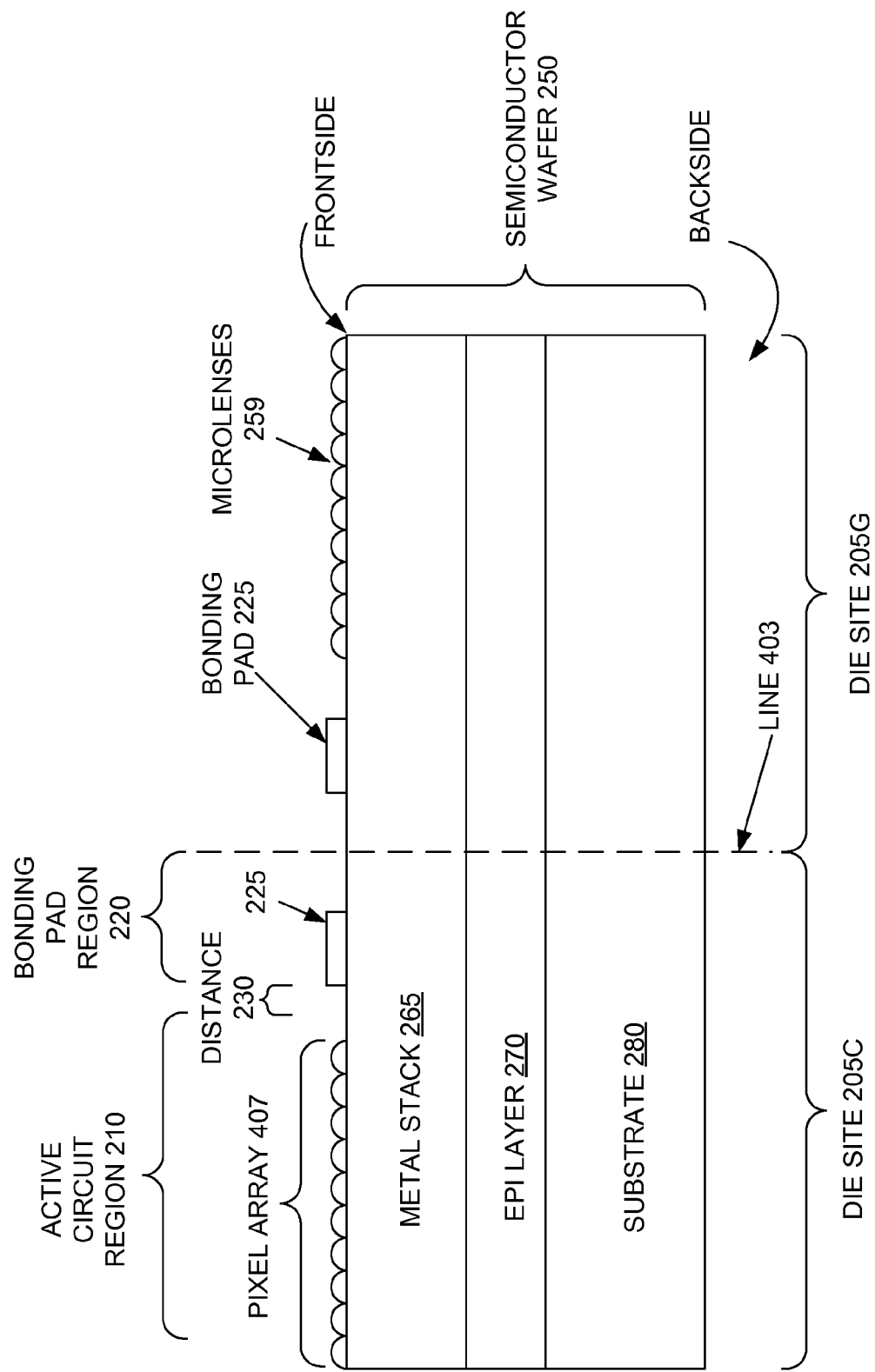

In process block 305, a pixel array (e.g. pixel array 407 in FIG. 4A) is formed in an octagon shaped active circuit region (e.g. active circuit region 210 as shown in FIG. 2A). The pixel array and associated readout circuitry may be formed in epi layer 270 or substrate layer 280 before disposing microlenses 259 on the front side of semiconductor wafer 250 (FIG. 4A). In process block 310, bonding pads (e.g. bonding pads 225) are posited adjacent to the four short sides of the octagon shaped active circuit region. FIG. 2A illustrates an octagon shaped active circuit region 210 with bonding pads 225 positioned adjacent to the four short side (or lengths) of the octagon. The bonding pads are formed on a frontside of the image sensor as shown in FIG. 4A.

FIG. 4A is a cross-sectional view through line B-B' of FIG. 2C that shows a process step of a method of fabricating an image sensor in a chip-scale package, in accordance with an embodiment of the disclosure. In the illustrated embodiment, the semiconductor device 200 disposed in die site 205C and die site 205G are (at least the beginnings of) frontside illuminated ("FSI") image sensors. It is appreciated that die sites 205C and 205G contain the same semiconductor devices 200 as die sites 205A, 205D, and 205H. FIG. 4A shows die site 205C and die site 205G separated by a vertical dashed line 403.

In the illustrated embodiment, metal stack layer 265 is disposed above epi layer 270, which is disposed above substrate layer 280. Bonding pads 225 and microlenses 259 are disposed on top of metal stack layer 265, which is the frontside of semiconductor wafer 250. Pixel array 407 is disposed in active circuit region 210, which may include active circuit elements such as logic gates, metal interconnect layers in metal stack layer 265, and dielectric material formed on top of substrate layer 280 or epi layer 270. Metal stack layer 265 comprises one or more layers of metal interconnect and dielectric material which separates layer(s) of metal interconnect from each other and/or layer(s) of metal interconnect from epi layer 270. Metal stack layer 265 is designed to allow light to pass through the metal interconnects to reach a photodetector that is part of each pixel in pixel array 407. In one embodiment, the semiconductor device 200 disposed in the die sites 205 is a backside illuminated ("BSI") image sensor that does not require light to pass through a metal stack layer to reach the photodetectors of the image sensor.

Still referring to FIG. 4A, epi layer 270 is formed on the frontside of substrate layer 280 in the illustrated embodiment. Epi layer 270 may be p-type doped, n-type doped or undoped. In one embodiment, epi layer 270 may be omitted, in which case, photosensitive regions (e.g. photodiodes) as well as the associated pixel and periphery circuits are formed in substrate layer 280.

Figure 4B:
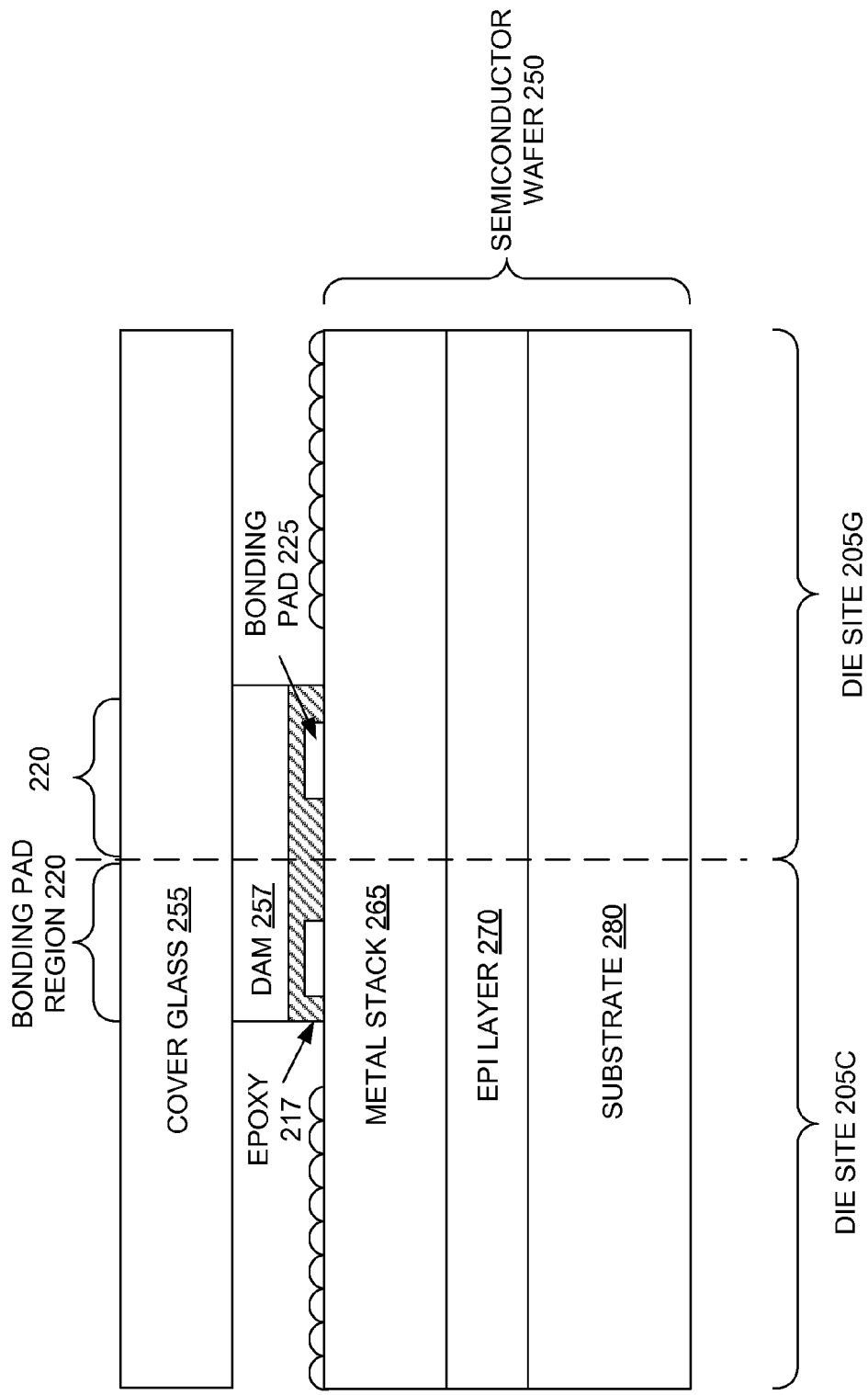

FIG. 4B is a cross-sectional view through line B-B' of FIG. 2C that shows a process step of a method of fabricating an image sensor in a chip-scale package, in accordance with an embodiment of the disclosure. Starting with the buildup of FIG. 4A, epoxy 217 is deposited in bonding pad region 220, which covers bonding pads 225. Epoxy 217 is an electrical insulator which protects bonding pads 225 from dust and moisture which could short-circuit bonding pads 225. Dam 257 is then formed over bonding pads 225 as support for cover glass 255. Cover glass 255 is disposed over semiconductor wafer 250 and adheres to dam 257.

FIG. 4C is a cross-sectional view through line B-B' of FIG. 2C that shows a process step of a method of fabricating an image sensor in a chip-scale package, in accordance with an embodiment of the disclosure. Starting with the buildup of FIG. 4B, substrate layer 280 (which may be made from silicon) is thinned down in a grind process. After placement of cover glass 255, the backside of substrate 380 is thinned using known methods such as chemical or mechanical planarization ("CMP"). In the illustrated embodiment, substrate layer 280 is thinned. In other embodiments, substrate layer 280 may be ground completely away (using CMP), leaving epi layer 270. Notch 420 is then formed in semiconductor wafer 250 between die site 205C and 205G in an etch process. Notch 420 runs through metal stack layer 265, epi layer 270, and substrate layer 280. It is appreciated that the slope of the sidewalls of the illustrated notch 420 may not be illustrated to scale. Notch 420 exposes a portion of bonding pads 225 and epoxy 217 at the frontside surface of metal stack layer 265.

Figure 4D:
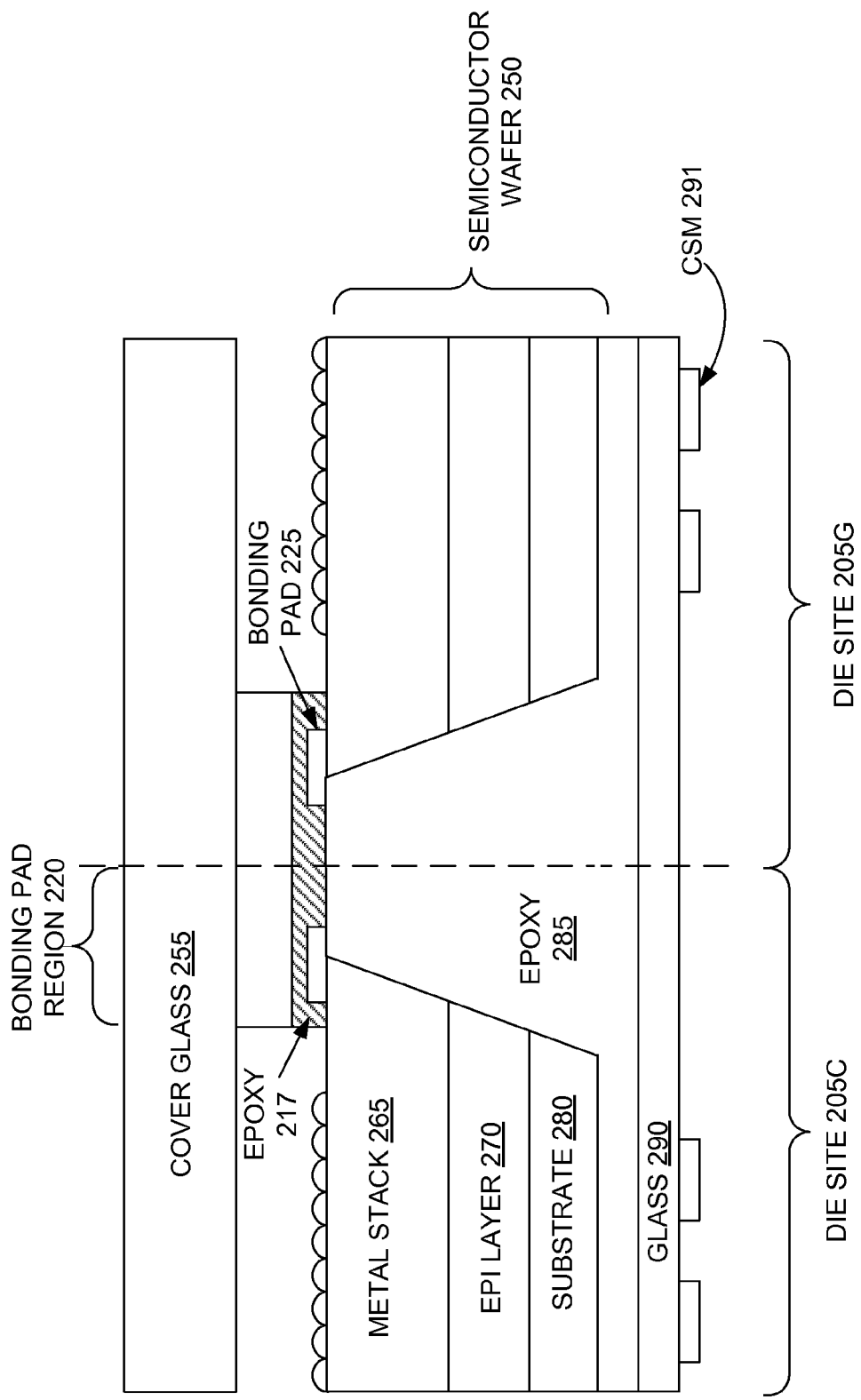

FIG. 4D is a cross-sectional view through line B-B' of FIG. 2C that shows a process step of a method of fabricating an image sensor in a chip-scale package, in accordance with an embodiment of the disclosure. Starting with the buildup of FIG. 4C, epoxy 285 is deposited from the backside of semiconductor wafer 250 to fill-in notch 420 and cover the backside of semiconductor wafer 250. Epoxy 285 provides electrical insulation for the regions of metal stack layer 265, epi layer 270, and substrate layer 280 that were exposed by the formation of notch 420. Epoxy 285 also provides electrical insulation for substrate layer 280 on the backside of semiconductor wafer 250. Glass 290 is placed on the backside of epoxy 285 and provides a surface for chip-scale metallization ("CSM") 291 to be formed on the backside of semiconductor wafer 250. CSM 291 provides a base conductive surface for BGA 299.

Figure 4E:
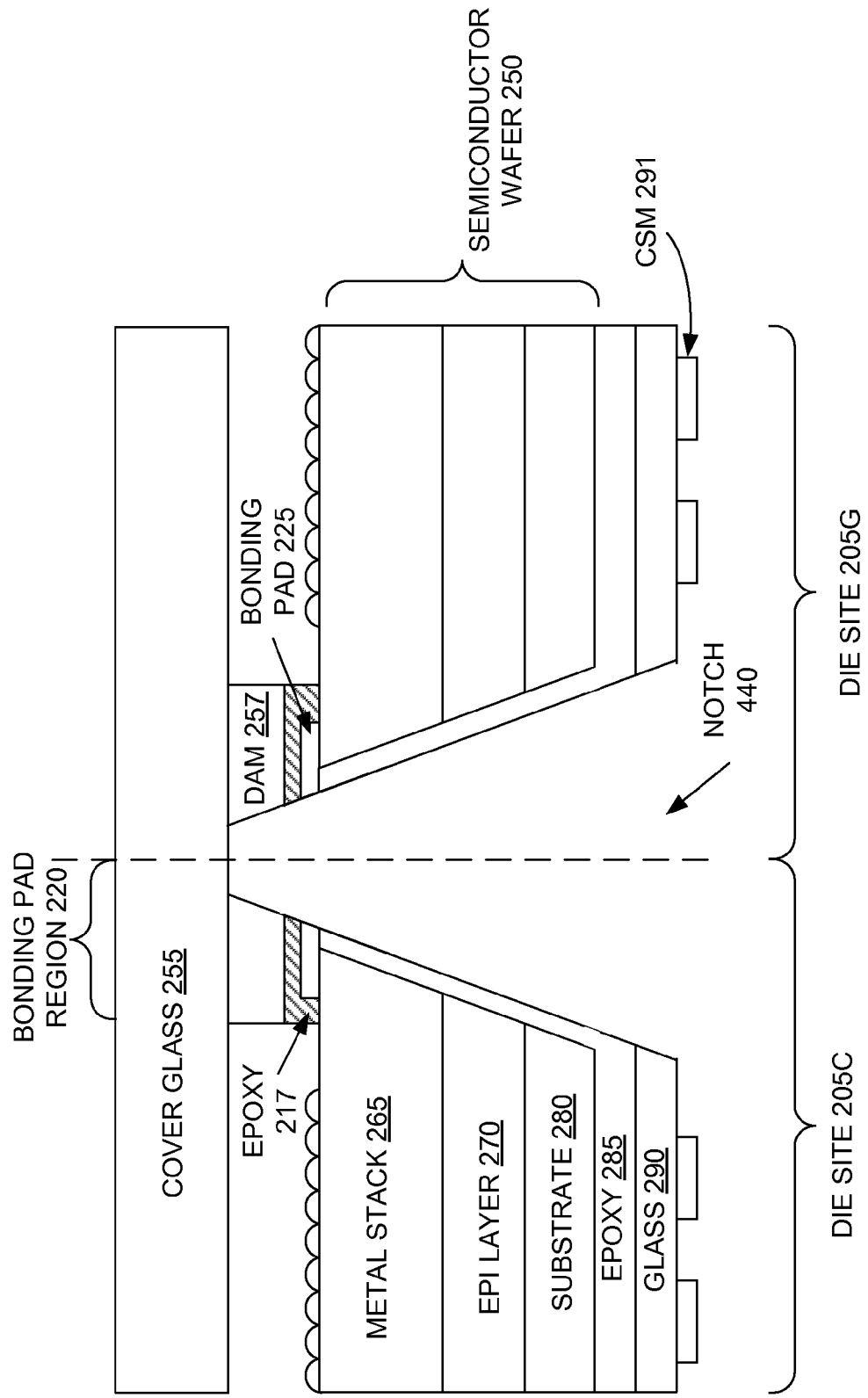

FIG. 4E is a cross-sectional view through line B-B' of FIG. 2C that shows a process step of a method of fabricating an image sensor in a chip-scale package, in accordance with an embodiment of the disclosure. Starting with the buildup of FIG. 4D, a notch 440 is formed through portions of glass 290, epoxy 285, epoxy 217, and dam 257. Notch 440 is formed using known methods of etching, or other methods of removing material found in semiconductor fabrication. A portion of epoxy 285 which is not etched away runs vertically from below substrate layer 280 up to bonding pad 225 to insulate metal stack layer 265, epi layer 270, and substrate 280. Notch 440 exposes a portion of bonding pads 225 that will eventually (after wafer dicing) face the outside of semiconductor device 200.

Figure 4F:
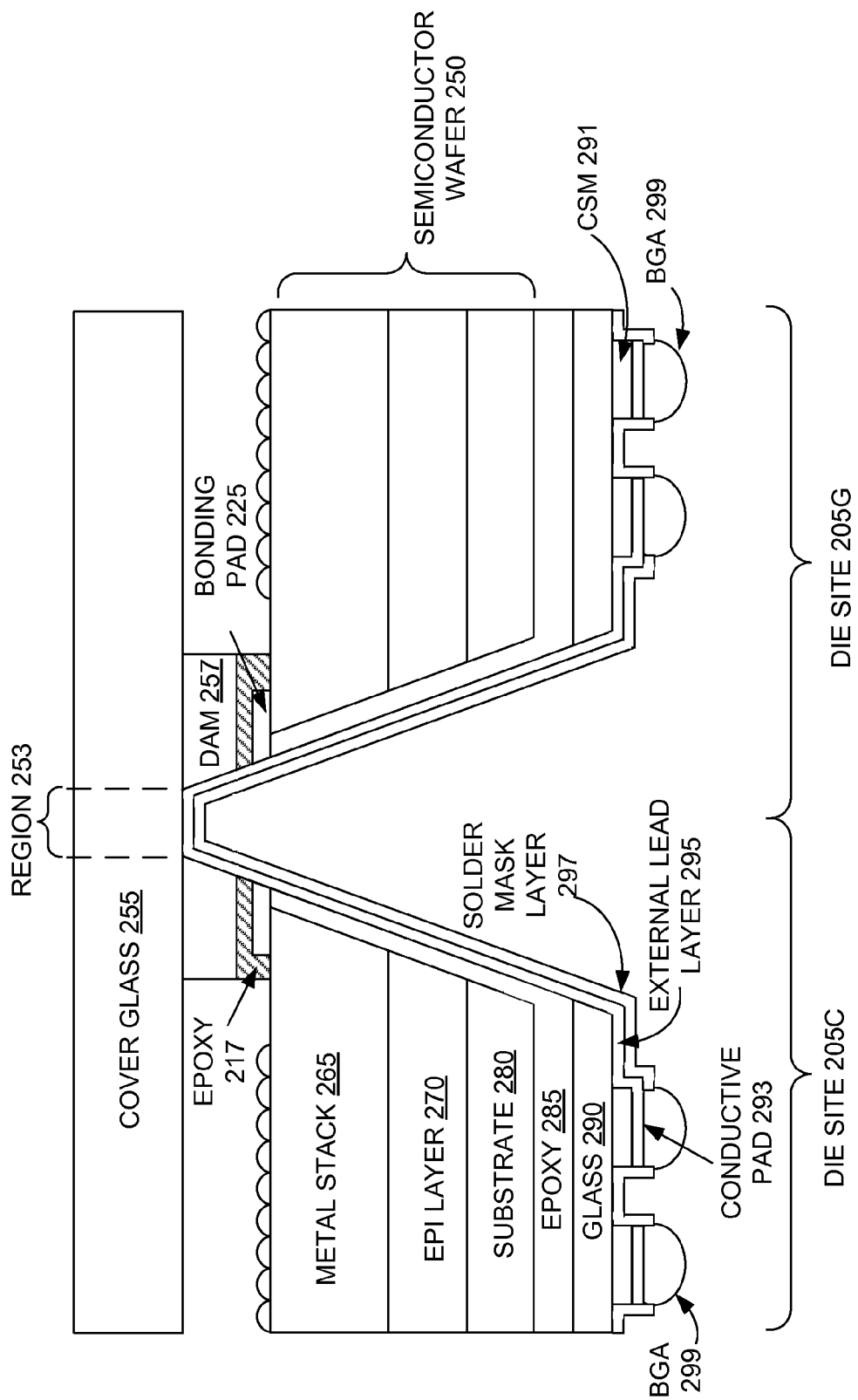

FIG. 4F is a cross-sectional view through line B-B' of FIG. 2C that shows a process step of a method of fabricating an image sensor in a chip-scale package, in accordance with an embodiment of the disclosure. Starting with the buildup of FIG. 4E, external lead layer 295 is deposited on the backside of semiconductor wafer 250. The portion of external lead layer 295 that is deposited on CSM 291 is a conductive pad 293. External lead layer 295 is deposited so that it runs substantially vertically from conductive pads 293 up to the portion of bonding pad 225 that was previously exposed by the formation of notch 440. External lead layer 295 provides an electrical connection from one of the conductive pads 293 on the backside of semiconductor wafer 250 up to one or more of bonding pads 225. A mask may be utilized to deposit external lead layer 295 in the correct locations. A solder mask layer 297 is formed on the backside of semiconductor wafer 250 that exposes conductive pads 293. Solder mask layer 297 may function as the external layer of semiconductor device 200. Solder is deposited to form BGA 299 underneath conductive pads 293. With the formation of BGA 299, an accessible, electrically conductive path is established that flows from BGA 299 to conductive pad 293, up external lead layer 295, into one or more of bonding pads 225, and then into metal stack layer 265. In other words, bonding pads 225 are part of an on-chip interface that is capable of receiving and transmitting electrical signals from the active circuit region to or from off-chip interfaces. After the formation of BGA 299, semiconductor wafer 250 is ready for wafer dicing.

Figure 5A:
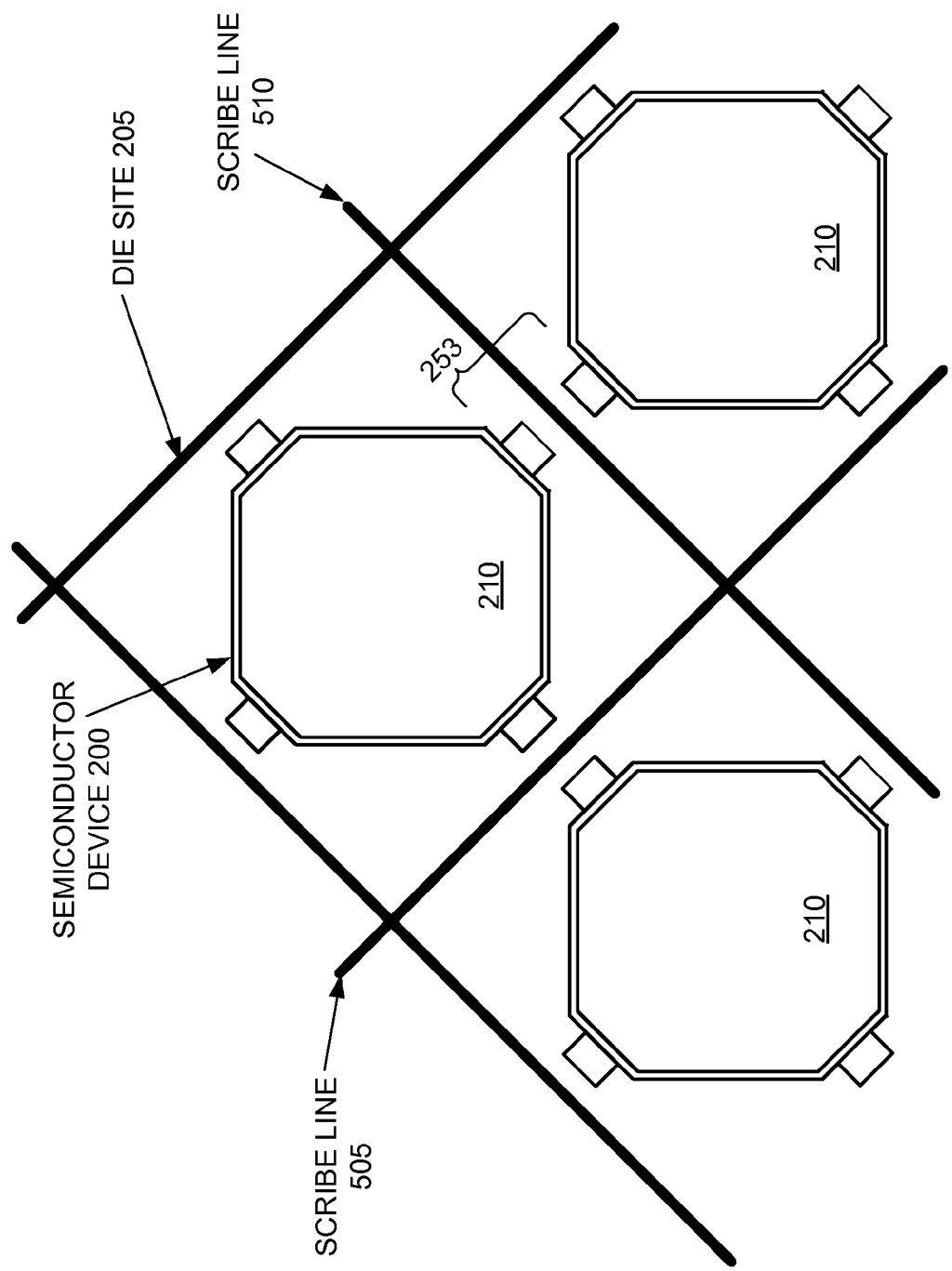
FIGS. 5A-5C show process steps relating to separating dies sites of a wafer to form semiconductor devices, in accordance with an embodiment of the disclosure.
Figure 5B:
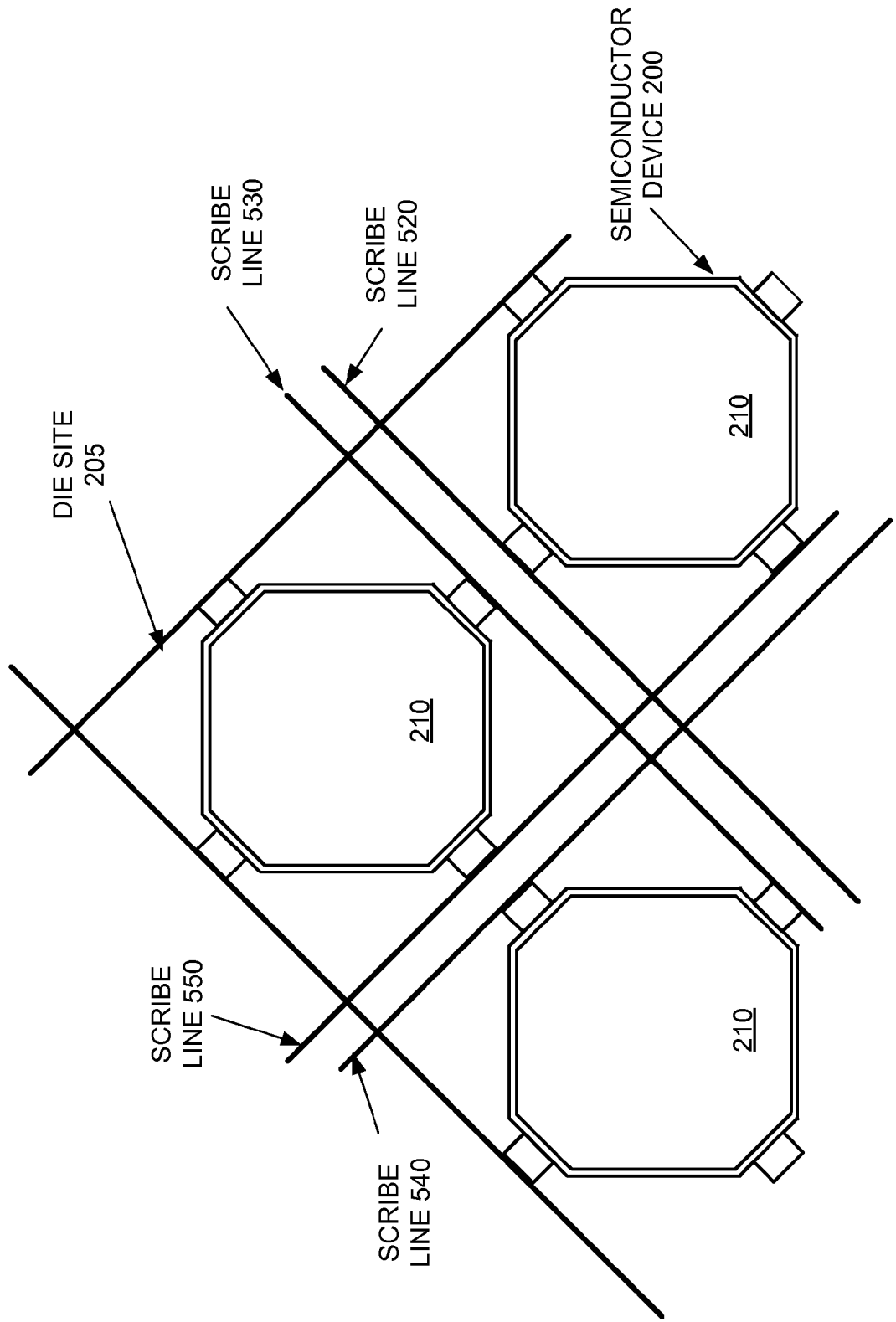

Referring back to FIG. 3, semiconductor wafer 250 is cut on first cut lines that are parallel to each of the four short sides of the octagon shaped active circuit region (e.g. active circuit region 210), in process block 315. As an illustration of an example of process block 315, FIG. 5A shows a scribe line 505 and a scribe line 510, each of which runs parallel to at least one of the short sides of octagon shaped active circuit regions 210. A die saw may be passed along scribe line 505 and 510 to assist in die separation. Scribe lines 505 and 510 are substantially perpendicular to one another. In FIG. 5A, a coarse die saw may be used along scribe line 505 and 510 to cut through and remove portions of cover glass 255, external lead layer 295, and solder mask layer 297. The width of the die saw may be the width of region 253. Referring to FIG. 5B, wafer dicing may include passing a fine die saw along two scribe lines that are parallel to (and proximate to) the short sides of octagon shaped active circuit region 210. In this case, a die saw may be used along scribe line 520, 530, 540, and 550, as illustrated in FIG. 5B. Scribe lines 520 and 530 are substantially perpendicular to scribe lines 540 and 550. It is appreciated that scribe lines 505, 510, 520, 530, 540, and 550 are examples of scribe lines and that more scribes lines (some of which are shown, but not necessarily labeled, in FIG. 5C) are likely needed to accomplish wafer dicing. It is also appreciated that the illustrated scribe lines may continue beyond what is illustrated.

Figure 5C:
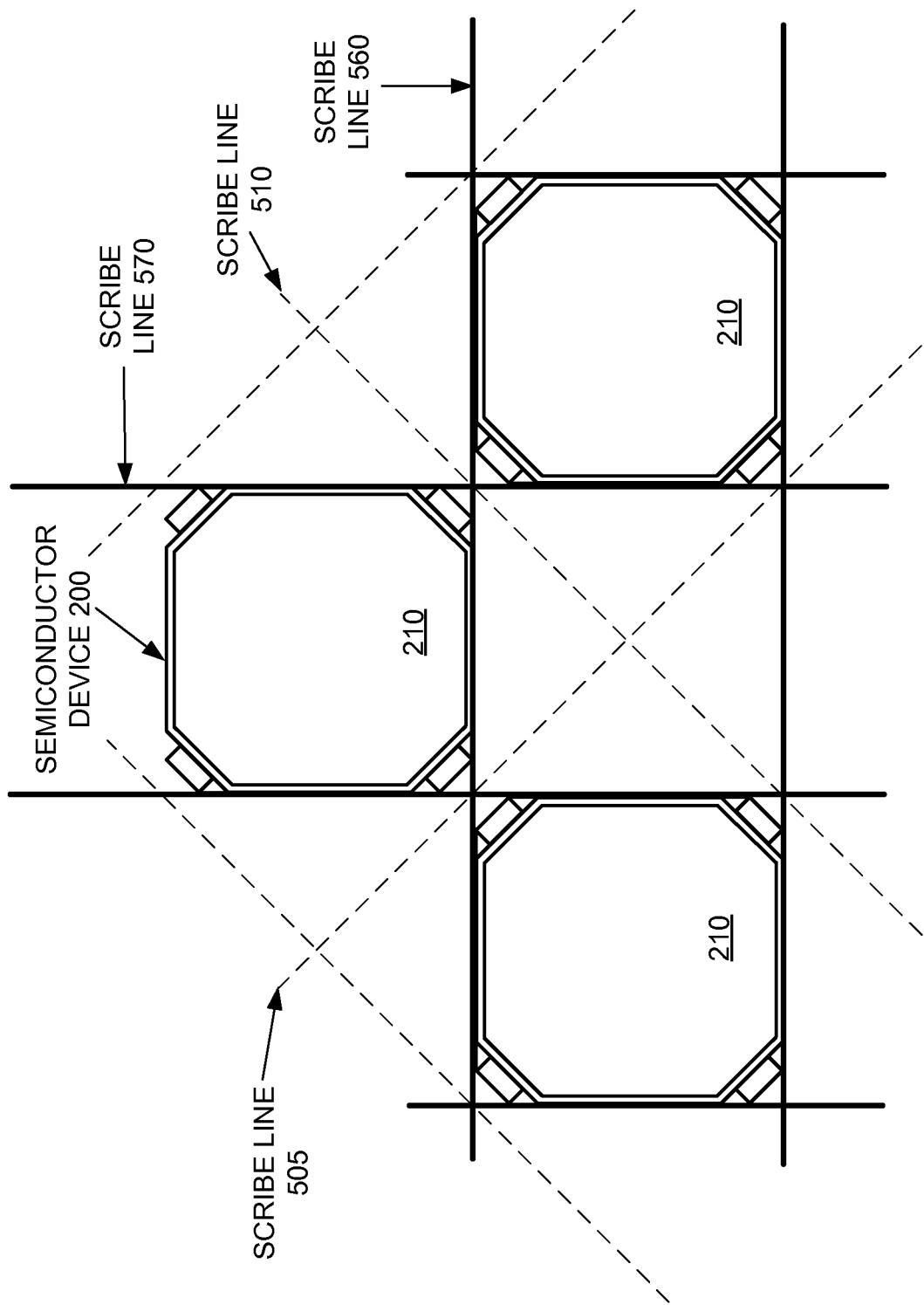

In process block 320, semiconductor wafer 250 is cut on second cut lines that are parallel to each of the four long sides of the octagon shaped active circuit region (e.g. active circuit region 210) to form an octagon shaped chip-scale package. As an illustration of an example of process block 320, FIG. 5C shows a scribe line 560 and 570 each of which runs parallel to at least one of the four long sides of octagon shaped active circuit regions 210. A die saw may be passed along scribe line 560 and 570 to assist in die separation. The die saw used along scribe line 560 and 570 may cut through and remove portions of cover glass 255, external lead layer 295, and solder mask layer 297. It is appreciated that the scribe lines 560 and 570 are at about a 45° angle from scribe lines 505, 510, 520, 530, 540, and 550. The scribe lines at 45° angles from one another results in semiconductor device 200 with octagon shapes or substantially rectangular shapes with chamfered corners, as shown in FIG. 2A. After wafer dicing, the individual semiconductors devices 200 disposed in die sites 205 are separated. The individual semiconductor devices 200 may then be assembled onto a substrate such as a printed circuit board.

Figure 6A:
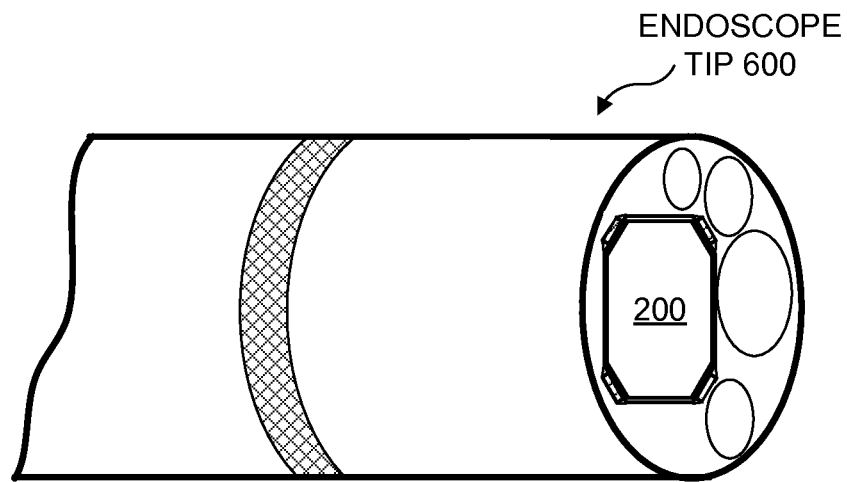
FIG. 6A is a perspective view of a diagram of an endoscope tip including an image sensor, in accordance with an embodiment of the disclosure.
Figure 6B:
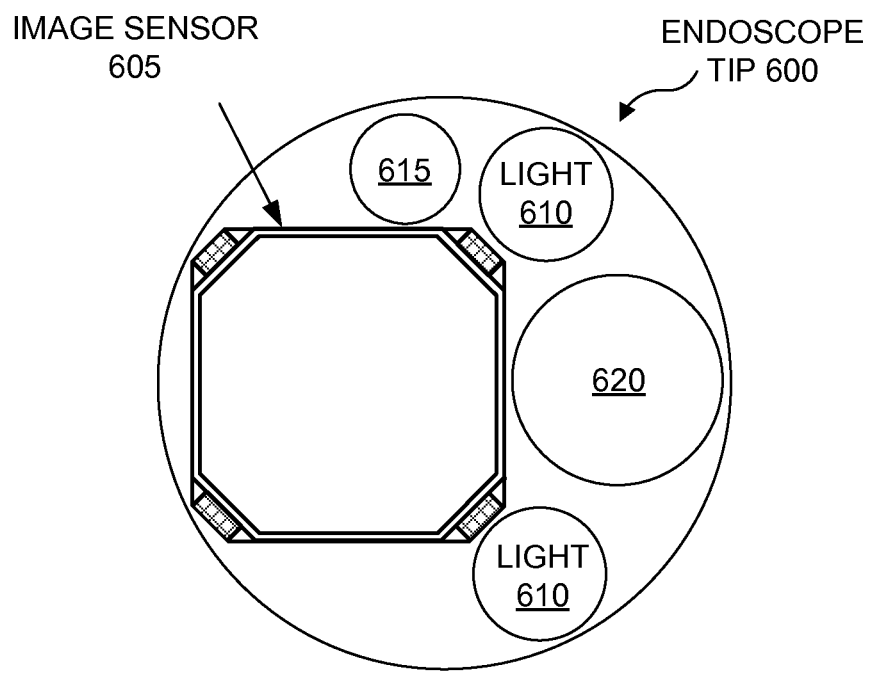
FIG. 6B is a front view of a diagram of an endoscope tip including an image sensor, in accordance with an embodiment of the disclosure.

FIG. 6A is a perspective view of a diagram of an endoscope tip 600 including an image sensor 605, in accordance with an embodiment of the disclosure. One application that could benefit from the design of semiconductor device 200 is having an image sensor 605 on endoscope tip 600. Endoscope tips are for inserting, often into a cavity to provide imaging data. In FIG. 6A, image sensor 605 is disposed on endoscope tip 200. FIG. 6B is a front view of endoscope tip 600 that includes light 610, and accessories 615 and 620. Endoscope tip 600 may be used in the medical field or otherwise. The accessories may include suction or forceps utilities. As shown in FIG. 6B, the chamfered corners (or short sides of the octagon perimeter) of image sensor 605 allow image sensor 605 to fit tighter up against the contours of endoscope tip 600. This may allow for improved, larger, or additional accessories to fit within endoscope tip 605, or it may allow for a reduction in overall size in endoscope tip 600. Any of these improvements may increase the success rate of the action being performed with the endoscope (such as surgery).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus comprising:
an image sensor with a frontside and a backside, the image sensor comprising:
an active circuit region having a first shape that is substantially rectangular, wherein the first shape has first chamfered corners, and wherein a perimeter of the frontside of the image sensor has a second shape that is substantially rectangular, the second shape having second chamfered corners; and
bonding pads disposed on the frontside of the image sensor, wherein the bonding pads are disposed between the first chamfered corners and the second chamfered corners, and wherein the first shape is disposed inside the second shape, and wherein a first chamfer length of each of the first chamfered corners is longer than a second chamfer length of each of the second chamfered corners.

2. The apparatus of claim 1, further comprising:
a conductive pad positioned to accept solder and disposed on the backside of the image sensor; and
an electrical connection layer connecting the conductive pad and at least one of the bonding pads, wherein the electrical connection layer is routed up to the at least one of the bonding pads from the conductive pad along an external layer of the image sensor.

3. The apparatus of claim 2, further comprising:
a metal stack layer of the image sensor having a first surface disposed along the frontside of the image sensor, wherein the first surface of the metal stack layer contacts the bonding pads, and wherein the metal stack layer is disposed between the bonding pads and the conductive pad.

4. The apparatus of claim 3, wherein the electrical connection layer is disposed external to, and not penetrating, the metal stack layer.

5. The apparatus of claim 3, wherein microlenses are disposed on the first surface of the metal stack layer between the bonding pads.

6. The apparatus of claim 3, wherein an epoxy layer is disposed between the metal stack layer and the electrical connection layer.

7. The apparatus of claim 6, wherein the epoxy layer contacts the bonding pads on a side of the bonding pads that also contacts the metal stack layer.

8. The apparatus of claim 3, wherein the active circuit region includes the metal stack layer, an epitaxial layer, and a substrate layer.

9. The apparatus of claim 1, wherein a buffer distance between the first chamfered corners and the second chamfered corners is approximately equal.

10. The apparatus of claim 1, wherein the bonding pads have a substantially rectangular shape and the bonding pads are disposed between two un-used semiconductor regions, wherein the two un-used semiconductor regions are substantially triangle shaped.

11. The apparatus of claim 1, further comprising:
an electronic endoscope having a tip for inserting, wherein the image sensor is disposed on a surface of the tip to be directed into the cavity, and wherein at least two of the second chamfered corners of the frontside of the image sensor are positioned proximate to, and facing, a contour edge of the surface of the tip to increase real estate available on the surface for including other components of the electronic endoscope.

12. A semiconductor device with a frontside and a backside, the semiconductor device comprising:
an active circuit region having a first shape that is substantially rectangular, wherein the first shape has first chamfered corners, and wherein a perimeter of the frontside of the semiconductor device has a second shape that is substantially rectangular, the second shape having second chamfered corners; and
bonding pads disposed on the frontside of the semiconductor device, wherein the bonding pads are disposed between the first chamfered corners and the second chamfered corners, and wherein the first shape is disposed inside the second shape, and wherein a first chamfer length of each of the first chamfered corners is longer than a second chamfer length of each of the second chamfered corners.

13. The semiconductor device of claim 12, further comprising:
a conductive pad positioned to accept solder and disposed on the backside of the semiconductor device; and
an electrical connection layer connecting the conductive pad and at least one of the bonding pads, wherein the electrical connection layer is routed up to the at least one of the bonding pads from the conductive pad along an external layer of the semiconductor device.

14. The semiconductor device of claim 13, further comprising:
a metal stack layer of the semiconductor device having a first surface disposed at the frontside of the semiconductor device, wherein the first surface of the metal stack layer contacts the bonding pads, and wherein the metal stack layer is disposed between the bonding pads and the conductive pad.

15. The semiconductor device of claim 14, wherein the electrical connection layer is disposed external to, and not penetrating, the metal stack layer.

16. The semiconductor device of claim 12, wherein an epoxy layer contacts the bonding pads on a side of the bonding pads that also contacts the metal stack layer.

17. The semiconductor device of claim 12, wherein first sides of the first chamfered corners are aligned and substantially parallel with second sides of the second chamfered corners.

18. The semiconductor device of claim 12, wherein the bonding pads are only disposed between the first chamfered corners and the second chamfered corners.

19. A semiconductor device with a frontside and a backside, the semiconductor device comprising:
   an active circuit region having a first shape that is substantially rectangular, wherein the first shape has first chamfered corners, and wherein a perimeter of the frontside of the semiconductor device has a second shape that is substantially rectangular, the second shape having second chamfered corners; and
   bonding pads disposed on the frontside of the semiconductor device, wherein the bonding pads are disposed between the first chamfered corners and the second chamfered corners, and wherein the first shape is disposed inside the second shape, and wherein the bonding pads are only disposed between the first chamfered corners and the second chamfered corners.

* * * * *